US005739465A

United States Patent [19]

Kameyama

[11] Patent Number: 5,739,465

[45] Date of Patent: Apr. 14, 1998

[54] CONNECTOR DEVICE AND CONNECTOR MOUNTING METHOD

[75] Inventor: Isao Kameyama, Shizuoka, Japan

[73] Assignee: Yazaki Corporation, Tokyo, Japan

[21] Appl. No.: 754,157

[22] Filed: Nov. 22, 1996

[30] Foreign Application Priority Data

Nov. 22, 1995 [JP] Japan .................................... 7-304390

[51] Int. Cl.[6] ................................ H02G 3/08; H05K 5/00

[52] U.S. Cl. ..................... 174/50.51; 220/3.92; 439/536; 200/51.09

[58] Field of Search .................................... 174/50, 50.51, 174/52.1, 17 R, 17 CT, 17.07, 50.6, 57, 58, 59, 65 R, 65 G; 220/3.2, 3.8, 3.92, 3.94, 4.02; 439/535, 536; 200/51.09, 51 R, 51.12, 51.13

[56] References Cited

U.S. PATENT DOCUMENTS

| | | | |
|---|---|---|---|
| 1,636,278 | 5/1927 | Benjamin | 439/313 |
| 5,262,923 | 11/1993 | Batta et al. | 361/685 |
| 5,562,341 | 10/1996 | Strauss | 362/226 |

FOREIGN PATENT DOCUMENTS

| | | | |
|---|---|---|---|
| 2-44579 | 11/1990 | Japan | B60K 37/04 |

*Primary Examiner*—Bot L. Ledynh
*Assistant Examiner*—Dhiru R. Patel
*Attorney, Agent, or Firm*—Sughrue, Mion, Zinn, Macpeak & Seas, PLLC

[57] ABSTRACT

A connector device including a tubular guide wall having front and rear open ends, a retaining portion for retaining a switch connection connector on an inner side of the tubular guide wall, and a retaining release unit for releasing the retaining of the switch connection connector by the retaining portion during the time when the switch connection connector and a switch connector are fitted together. With this construction, the reliability of the connection portion of the connector is enhanced, and the efficiency of the operation is enhanced.

18 Claims, 7 Drawing Sheets

CONNECTOR DEVICE AND CONNECTOR MOUNTING METHOD

BACKGROUND OF THE INVENTION

1. Field of the Invention

This invention relates to a connector device, and more particularly to a connector device to be mounted, for example, on an instrument panel of an automobile on which various switches are mounted, and the invention also relates to a connector mounting method.

2. Description of the Related Art

As shown in FIG. 7, a mounting portion for an option switch 2, such as a fog lamp switch and an air conditioner switch, is provided on an instrument panel 1 of an automobile. For mounting the option switch 2 on the instrument panel 1, a mounting hole 3 is formed in an option switch mounting portion of the instrument panel 1, and a switch connection harness 4 is passed from a rear side of the instrument panel 1 to its front side through the mounting hole 3, and is connected to the option switch 2. Then, the option switch 2 thus connected to the harness 4 is pushed into the mounting hole 3 formed in the mounting portion of the instrument panel 1. However, this operation, in which the switch connection harness 4 is passed from the rear side of the instrument panel 1 to its front side through the mounting hole 3, can not be effected easily partly because the mounting hole 3 is small in size, and therefore the efficiency of this operation is low. Besides, when pushing the option switch 2 into the mounting hole 3 in the instrument panel 1, the switch connection harness 4, connected to the option switch 2, is pushed into the mounting hole 3 together with the option switch 2, and therefore there have been encountered problems that the switch connection harness 4 is caught by the instrument panel 1, so that wires of the switch connection harness 4 are cut, and that the switch connector harness 4 can not be stored at the rear side of the instrument panel 1, so that the option switch 2 can not be fixed to the instrument panel 1.

Japanese Utility Model Examined Publication No. Hei. 2-44579 discloses a connector device as shown in FIGS. 8 and 9, in which a connector 7, which has a tubular body having an open front end, and has a harness bonded to an inner side of this tubular body, is formed or molded integrally with a switch mounting portion 3 of an instrument panel 1 through thin ribs 15. In this construction, a switch 10 is fitted in that portion of the connector 7 (provided at the switch mounting portion) extending rearwardly from the instrument panel 1, and then the switch 10 is further pushed into its proper mounting position while breaking the thin ribs 15 by this pushing force.

In this construction, however, even the internal structure of the tubular body of the connector 7 is integral with the instrument panel 1, and therefore the shape is complicated, and it is very difficult to mold this construction. Besides, since even a connection terminal portion of the connector 7 is molded integrally with the instrument panel 1, there is a problem with the reliability of electrical connection. Further, since the connector 7, to which the switch 10 is connected, is disposed rearwardly of the instrument panel 1, the switch 10 can not be easily connected to the connector 7. Further, after the switch 10 is connected to the connector 7, the switch 10 is pushed into its proper mounting position while breaking the thin ribs 15 off the instrument panel 1, and therefore if the thin ribs 15 are once broken, a change or re-insertion of the switch can not be effected. Furthermore, when exchanging the switch at the time of maintenance, the wire harness need to be pulled together with the switch, and when again inserting the switch into the hole in the instrument panel, the wire harness may be caught by the instrument panel, so that wires of the wire harness are cut.

SUMMARY OF THE INVENTION

With the above problems in view, it is an object of the invention to provide a connector device in which the reliability of a connection portion of a connector is enhanced, and the efficiency of the operation can be enhanced.

In order to achieve the above object, the invention provides a connector device comprising: a tubular guide wall having front and rear open ends; a retaining portion for retaining one connector on an inner side of the tubular guide wall; and retaining release means for releasing the retaining of the one connector by the retaining portion during the time when the one connector and other connector are fitted together.

The invention also provides a connector device comprising: a tubular guide wall having front and rear open ends; a retaining portion for retaining one connector on an inner side of the tubular guide wall; and retaining release means for releasing the retaining of the one connector by the retaining portion during the time when the one connector and other connector are fitted together, and for causing the retaining portion to retain the one connector during the time when the fitting between the one connector and the other connector is released.

Further, the invention provides a connector mounting method comprising the steps of: retaining one connector on a tubular guide wall having front and rear open ends; fitting the one connector and other connector together; releasing the retaining of the one connector; and sliding the two connectors along the tubular guide wall into their respective proper positions.

The invention also provides a connector mounting method comprising the steps of: retaining one connector on a tubular guide wall having front and rear open ends; fitting the one connector and other connector together; releasing the retaining of the one connector; sliding the two connectors along the tubular guide wall into their respective proper positions; and withdrawing the other connector so that the two connectors are slid along the tubular guide wall, and the one connector is retained in its initial position and disengaged from the other connector.

DETAILED DESCRIPTION OF THE PREFERRED EMBODIMENT

A preferred embodiment of the present invention will now be described in detail with reference to the drawings.

Figure 7:
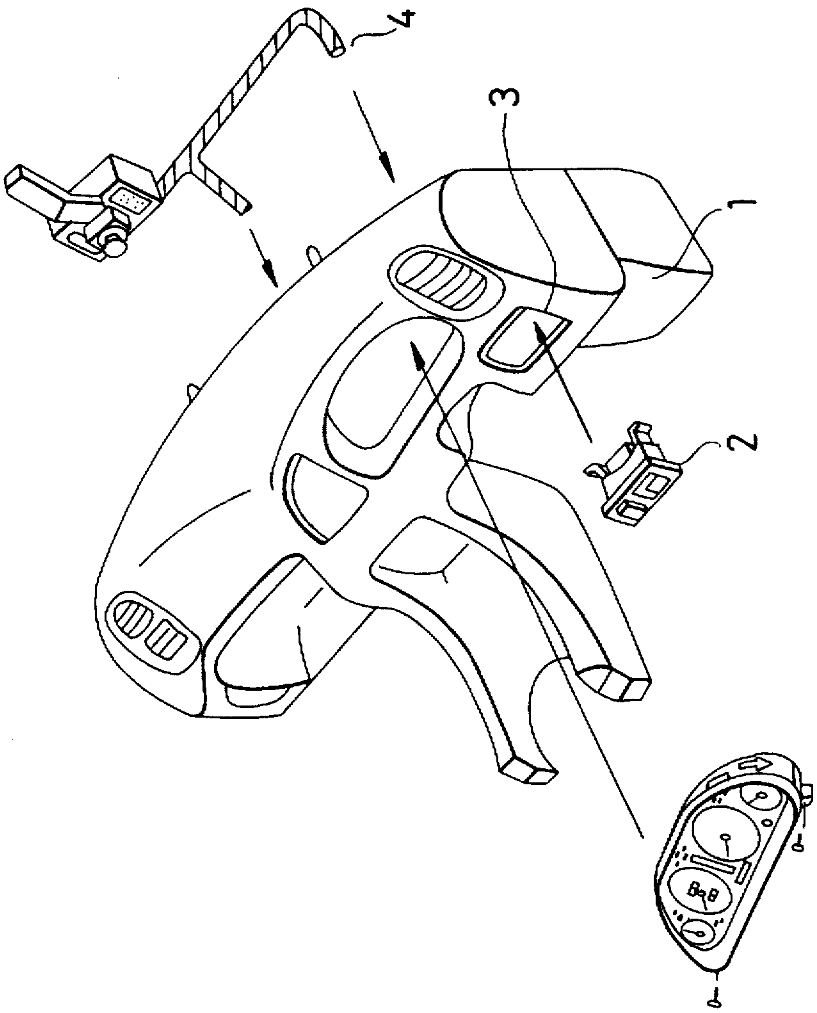
FIG. 7 is a schematic view showing an instrument panel, to which the invention is applied, a switch to be mounted on the instrument panel, and a harness.
Figure 8:
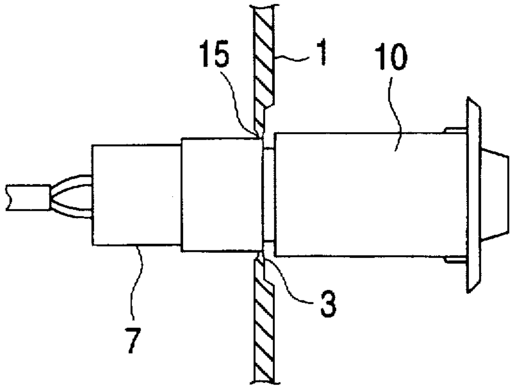
FIG. 8 PRIOR ART
FIG. 8 is a view showing a conventional connector device and a conventional connector mounting method.
Figure 9:
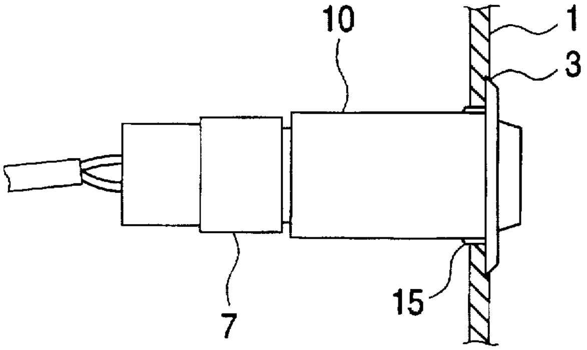
FIG. 9 PRIOR ART
FIG. 9 is a view showing the conventional connector and the conventional connector mounting method.

FIG. 7 is a schematic view showing an instrument panel of an automobile, a switch to be mounted on the instrument panel, and a harness. Reference numerals 1, 2, 3 and 4 designate the instrument panel made of a synthetic resin, an option switch, a switch mounting hole formed through the instrument panel, and a switch connection harness to be connected to the option switch, respectively. Usually, a plurality of switch mounting portions are provided.

Figure 1:
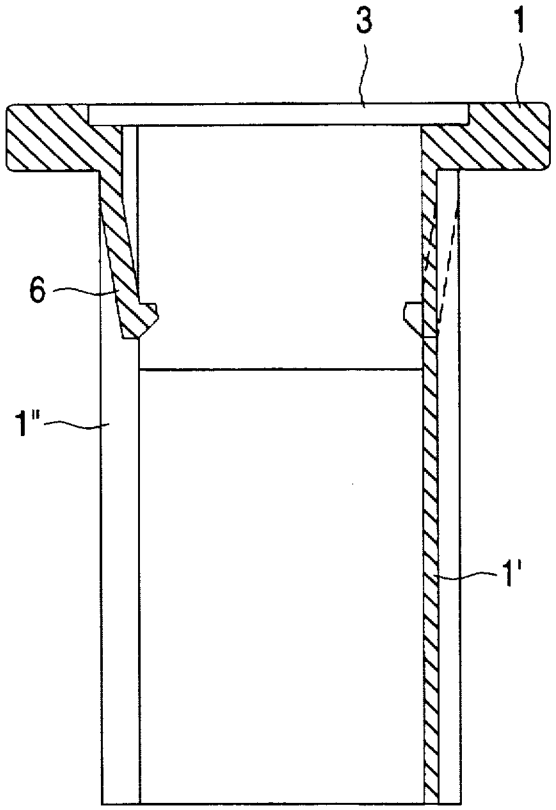
FIG. 1 is a cross-sectional view of a switch mounting portion of an instrument panel.
Figure 2:
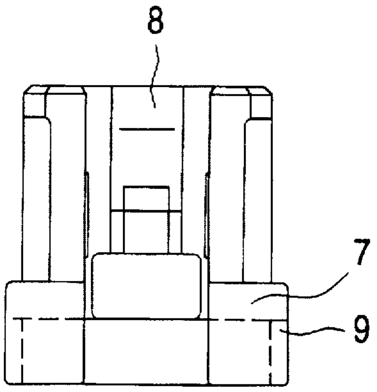
FIG. 2 is a cross-sectional view of a switch connection connector.

Details of the switch mounting portion is shown in FIGS. 1 to 6. FIG. 1 is a cross-sectional view of the switch mounting portion of the instrument panel, and FIG. 2 is a cross-sectional view of a switch connection connector.

As shown in FIG. 1, a tubular guide wall 1', conforming in shape to the switch connection connector and a switch connector, is formed on the instrument panel 1 at a peripheral edge portion of the mounting hole 3. In this embodiment, the switch mounting hole 3, to which one end of the tubular guide wall 1' is open, has a rectangular shape, and grooves 1" of a channel-shaped cross-section are formed respectively in opposed (right and left) walls of the tubular guide wall 1', and extend toward a rear end of the tubular guide wall 1'. A pair of connector retaining projections 6 for retaining the switch connection connector 7 are formed respectively on opposed inner surfaces of the tubular guide wall 1' at the respective grooves 1", and are disposed slightly rearwardly of the open end (that is, the connector retaining projections 6 are disposed at such positions that they can retain the switch connection connector 7 in such a manner that the switch connection connector 7 projects slightly from the front surface of the instrument panel 1 so that the switch connector 13 can be easily connected to the switch connection connector 7). The connector retaining projections 6 are molded of an elastic material. Each of the connector retaining projections 6 is in the form of a bar of a square cross-section, and is slanting toward the axis of the tubular guide wall 1', and has a tapered hook at its distal end. A disengagement prevention projection 14, directed inwardly, is formed at the rear end of the tubular guide wall 1'. The disengagement prevention projection 14 may be formed on the entire periphery of the rear end of the tubular guide wall 1', or two projections 14 may be formed respectively on opposed sides of the rear end, or three projections 14 may be formed respectively on three sides of the rear end.

As shown in FIG. 2, the switch connection connector 7 includes a semi-lock 8 molded of an elastic material, and has retaining holes 9 of a square shape in which the connector retaining projections 6 are engageable, respectively, so as to retain the switch connection connector 7 at the front surface of the instrument panel 1. The switch connection harness 4, passed through the switch mounting hole 3, is connected to a connection terminal of the switch connection connector 7.

Figure 3:
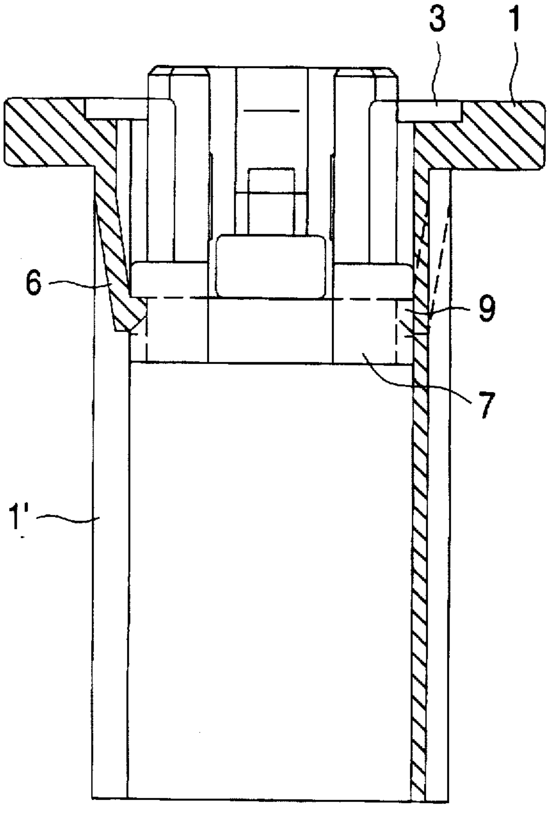
FIG. 3 is a cross-sectional view showing a condition in which the switch connection connector is mounted on the instrument panel.

FIG. 3 is a cross-sectional view showing a condition in which the switch connection connector 7 is mounted on the instrument panel 1. The switch connection connector 7 is retained by the connector retaining projections 6 and the retaining holes 9 in such a manner that the switch connection connector 7 is projected from the front surface of the instrument panel 1.

Figure 4:
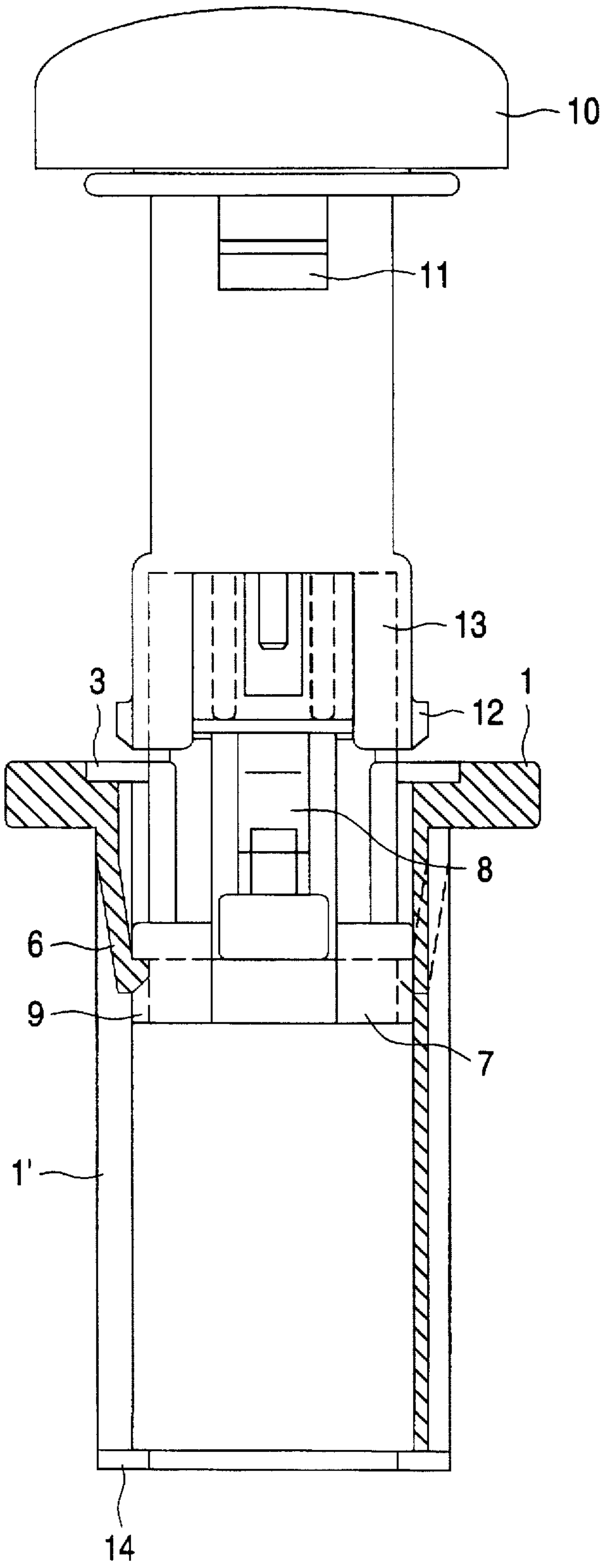
FIG. 4 is a cross-sectional view showing a first condition in which a switch is being connected to the switch connection connector fixed to the instrument panel.

FIG. 4 is a cross-sectional view showing a condition in which a switch 10 is connected to the switch connection connector 7 fixed to the instrument panel 1. The switch 10 includes the switch connector 13 integrally molded therewith, a retaining portion 11 provided at a central portion of the switch connector 13, and a pair of convex projections 12 formed respectively on opposite sides of the switch connector 13. The projections 12 are provided so as to be in registry with the connector retaining projections 6 of the switch connection connector 7, respectively, and each of the projections 12 has a tapered distal end.

A method of mounting the connector device of this embodiment will not be described.

As shown in FIG. 3, when the switch connection connector 7 is inserted into the mounting hole 3 in the instrument panel 1 from the front side of the instrument panel 1, the connector retaining projections 6 are moved outwardly, that is, away from each other in accordance with the insertion of the switch connection connector 7, and when the retaining holes 9 in the switch connection connector 7 reach the connector retaining projections 6, respectively, the elastic connector retaining projections 6 are restored into their initial condition, and are retainingly engaged respectively in the retaining holes 9, thereby fixing the switch connection connector 7 to the instrument panel 1. In this condition, the switch connection connector 7 is projected from the front surface of the instrument panel 1.

Figure 5:
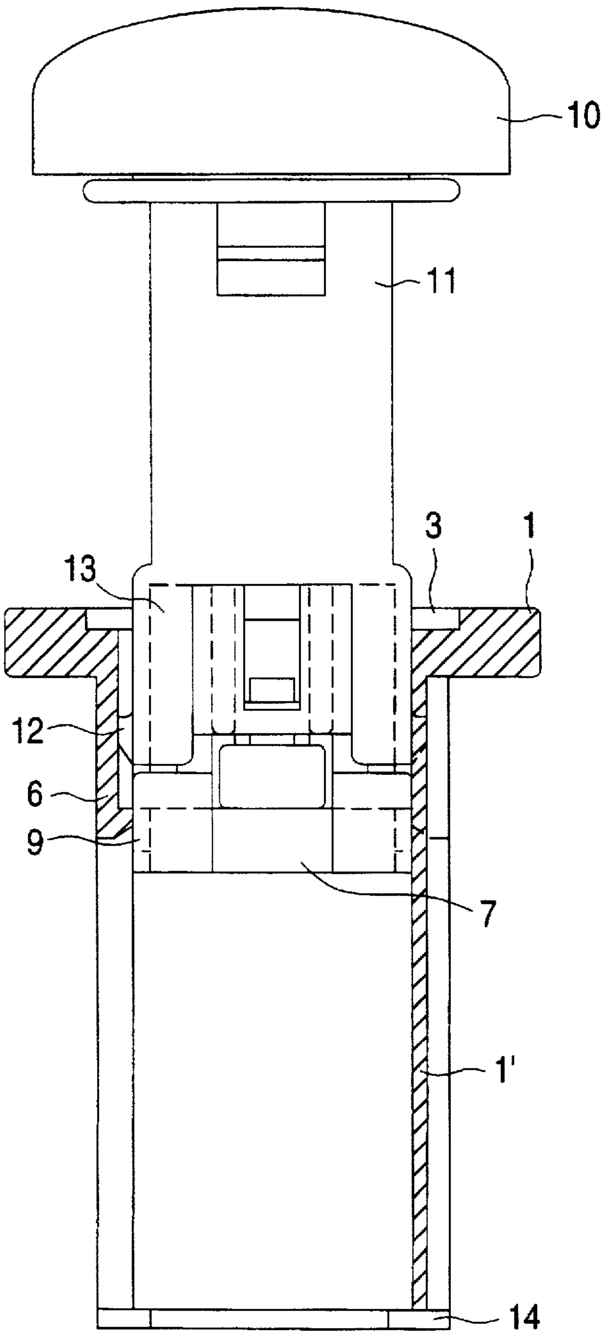
FIG. 5 is a cross-sectional view showing a second condition in which the switch is being connected to the switch connection connector fixed to the instrument panel.
Figure 6:
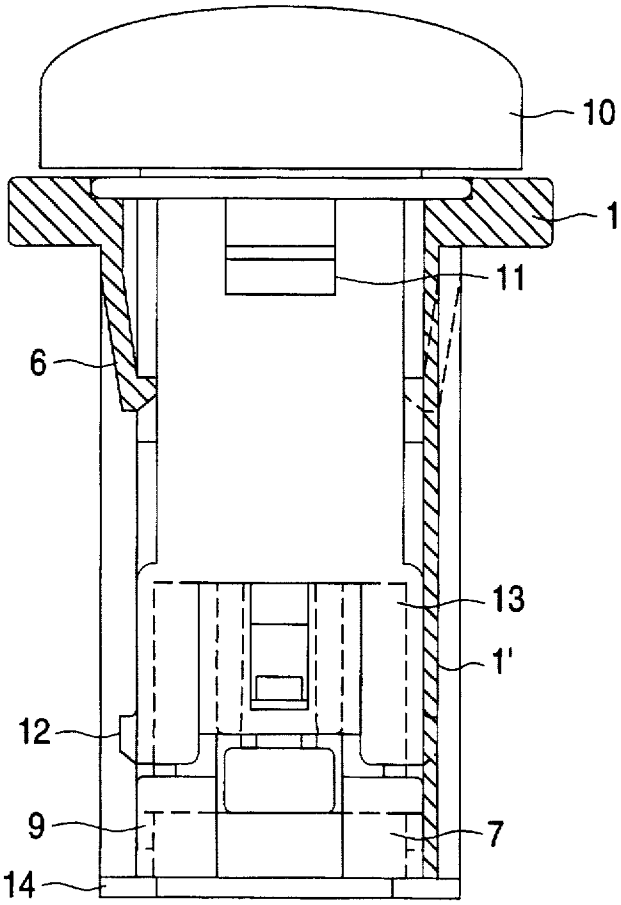
FIG. 6 is a cross-sectional view showing a third condition in which the switch is being connected to the switch connection connector fixed to the instrument panel.

For connecting the switch 10 to the switch connection harness 4 as shown in FIGS. 4, 5 and 6, the switch connector 13, integrally molded with the switch 10, is brought into registry with the switch connection connector 7 fixed to the instrument panel 1, and then is pushed toward the instrument panel 1. At this time, the semi-lock 8 of the switch connection connector 7 is elastically deformed, and when the two connectors are connected together, the semi-lock 8 is returned by a reaction force, and is engaged with the switch connector 13. Simultaneously when the two connectors are completely fitted together, the projections 12 of the switch connector 13 respectively flex the connector retaining projections 6 of the instrument panel 1 outwardly, so that the locking engagement of the connector retaining projections 6 with the switch connection connector 7 is released (FIG. 5). Therefore, the switch 10 can be further inserted rearwardly relative to the instrument panel 1, and finally the switch 10 is retained on the instrument panel 1 by the retaining portion 11, and hence is fixed in a proper position (FIG. 6). As described above, the disengagement prevention projection 14 is provided at the rear end of the tubular guide wall 1', and therefore even if the switch 10 is pushed excessively, the connector and others will not drop at the rear side of the instrument panel 1.

The switch 10, when withdrawn from the instrument panel 1, is returned into its initial condition (FIG. 4), and can effect the operation again.

The switch connection harness 4 may be connected from the rear side of the instrument panel 1 after the switch connection connector 7 and the switch 10 are mounted in position on the instrument panel 1.

In the connector device of the present invention, the switch connection connector and others can be retained at arbitrary positions within the tubular guide wall, and can be moved. Therefore, the switch connection connector is retained in such a manner that the switch connection connector is projected from the front surface of the instrument panel, and therefore the switch connector can be easily connected to the switch connection connector. If the switch connector and the switch connection connector are not completely fitted together, the locking engagement of the connector retaining projections with the switch connection connector is not released, and it is impossible to further insert the switch, and therefore the reliability of the switch connection is markedly enhanced. The switch connection connector is molded separately from the instrument panel, and therefore can be molded more easily than the case where the switch connection connector is molded integrally with the instrument panel, and this ensures a sufficient reliability of the wire connection. Since the molding is easier, the yield of molding the switch connection connectors is high, and the cost of the parts can be reduced. The two connectors can be smoothly guided by the tubular guide wall, and therefore the harness will not be caught by the instrument panel, and hence the wires of the harness will not be cut. Besides, the switch connection harness can be satisfactorily stored at the rear side of the instrument panel, and switch wiring can be easily installed, thereby enhancing the efficiency of the operation. The disengagement prevention projection is provided at the rear end of the tubular guide wall, and therefore the connector and other parts will not drop at the rear side of the instrument panel. The retaining portions can perform their functions repeatedly, and therefore a change and repair after mounting the connector device can be easily dealt with.

As described above, the present invention overcomes the various problems, and achieves excellent practical effects.

What is claimed is:

1. A connector device comprising:

a guide wall having front and rear open ends and defining a connector-receiving chamber therein;

a retaining portion, attached to said guide wall, for retaining a first connector when said first connector is received in said connector-receiving chamber; and retaining release means for automatically releasing said first connector which is retained by said retaining portion during a time when said first connector and a second connector are fitted together such that said first and second connectors can be slid toward said rear open end of said connector-receiving chamber.

2. The connector device according to claim 1, wherein said guide wall is formed on a switch mounting panel, and said second connector is integral with a switch.

3. The connector device according to claim 2, wherein said switch mounting panel is an instrument panel of an automobile.

4. The connector device according to claim 2, wherein said guide wall is molded integrally with said switch mounting panel.

5. The connector device according to claim 2, wherein said guide wall is molded separately from said switch mounting panel and connected thereto.

6. The connector device according to claim 1, further comprising fixing means for fixing said second connector in a proper position.

7. The connector device according to claim 1, wherein said retaining portion is formed in a form of a bar having a square cross-section, slanting toward a longitudinal axis of said guide wall.

8. The connector device according to claim 7, wherein said retaining portion has a tapered hook at the distal end of the bar for engaging with a retaining hole formed on said first connector.

9. The connector device according to claim 6, wherein said first connector further comprises a semi-lock formed thereon for engaging with said second connector.

10. The connector device according to claim 1, further comprising a disengagement prevention projection provided at the rear open end of said guide wall.

11. A connector device comprising:

a guide wall having front and rear open ends and defining a connector-receiving chamber therein;

a retaining portion, attached to said guide wall, for retaining a first connector when said first connector is received in said connector-receiving chamber; and retaining release means for automatically releasing said first connector which is retained by said retaining portion during a time when said first connector and a second connector are fitted together, and for causing said retaining portion to retain said first connector during the time when the fitting between said first connector and said second connector is released.

12. The connector device according to claim 11, wherein said guide wall is formed on a switch mounting panel, and said second connector is integral with a switch.

13. The connector device according to claim 12, wherein said switch mounting panel is an instrument panel of an automobile.

14. The connector device according to claim 12, wherein said guide wall is molded integrally with said switch mounting panel.

15. The connector device according to claim 12, wherein said guide wall is molded separately from said switch mounting panel and connected thereto.

16. The connector device according to claim 11, further comprising fixing means for fixing said second connector in a proper position.

17. A connector mounting method comprising the steps of:

retaining a first connector on a guide wall having front and rear open ends;

fitting said first connector and a second connector together;

releasing the retaining of said first connector; and sliding said first and second connectors along said guide wall into their respective proper positions.

18. A connector mounting method comprising the steps of:

retaining a first connector on a guide wall having front and rear open ends;

fitting said first connector and a second connector together;

releasing the retaining of said first connector;

sliding said first and second connectors along said guide wall into their respective proper positions; and withdrawing said second connector so that said first and second connectors are slid along said guide wall, and said first connector is retained in its initial position and disengaged from said second connector.

* * * * *